(12) United States Patent
Bechtel et al.

(10) Patent No.: US 8,193,694 B2
(45) Date of Patent: Jun. 5, 2012

(54) ELECTROLUMINESCENT DEVICE WITH IMPROVED LIGHT DECOUPLING

(75) Inventors: Hans-Helmut Bechtel, Roetgen (DE);
Dietrich Bertram, Aachen (DE);
Markus Klein, Tegernheim (DE);
Volker Weiler, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 1345 days.

(21) Appl. No.: 12/092,295

(22) PCT Filed: Mar. 9, 2004

(86) PCT No.: PCT/IB2004/000801
§ 371 (c)(1),
(2), (4) Date: Oct. 26, 2010

(87) PCT Pub. No.: WO2004/086823
PCT Pub. Date: Oct. 7, 2004

(65) Prior Publication Data
US 2011/0031474 A1    Feb. 10, 2011

(30) Foreign Application Priority Data

Mar. 26, 2003    (EP) .................................. 03100779

(51) Int. Cl.
*H01J 1/62*    (2006.01)
(52) U.S. Cl. .................... 313/503; 313/498; 313/506
(58) Field of Classification Search ................. 313/498, 313/503, 506, 512
See application file for complete search history.

(56) References Cited

U.S. PATENT DOCUMENTS

| 4,816,717 | A  | * | 3/1989  | Harper et al. | ............... 313/502 |
| 6,831,411 | B2 | * | 12/2004 | Tanabe et al. | ............... 313/506 |
| 2008/0136314 | A1 | * | 6/2008 | Brown et al. | ............... 313/503 |

* cited by examiner

*Primary Examiner* — Vip Patel
(74) *Attorney, Agent, or Firm* — Mark L. Beloborodov

(57) ABSTRACT

An electroluminescent device includes a substrate and a sandwich consisting of a first electrode, an electroluminescent layer and a second electrode. To improve decoupling of light from the electro-luminescent device, a layer comprising conductive particles adjoins the first or second electrode.

10 Claims, 2 Drawing Sheets

ELECTROLUMINESCENT DEVICE WITH IMPROVED LIGHT DECOUPLING

The invention relates to an electroluminescent device which comprises a substrate and a sandwich, said sandwich consisting of a first electrode, an electroluminescent layer and a second electrode.

Electronically actuated display systems are known and widely used in various forms based on various principles.

One principle makes use of organic light-emitting diodes, known as OLEDs, as light source. Organic light-emitting diodes are composed of a number of functional layers. A typical structure of an OLED is described in "Philips Journal of Research, 1998, 51, 467". A typical structure comprises a layer of ITO (Indium Tin Oxide) as transparent electrode (anode), a conductive polymer layer, an electroluminescent layer, that is to say a layer of a light-emitting material, particularly of a light-emitting polymer, and an electrode composed of a metal, preferably a metal having a low work function (cathode). Such a structure is conventionally applied to a substrate, usually glass. The light produced reaches the viewer through the substrate. An OLED comprising a light-emitting polymer in the electroluminescent layer is also referred to as a polyLED or PLED.

Such a device has the disadvantage that the light produced in the electroluminescent layer partly leaves the latter in the direction of the viewer not via the shortest route but rather passes to the outer edges of the device by total reflection at the interfaces between the individual layers, for example at the interface between the transparent electrode and the substrate or between the electroluminescent layer and the transparent electrode. Up to 80% of the light produced is lost on account of this internal total reflection.

It is therefore an object of the present invention to provide an electroluminescent device based on an OLED, which has improved light decoupling.

This object is achieved by an electroluminescent device which comprises a substrate and a sandwich that adjoins the substrate, said sandwich consisting of at least a first electrode, an electroluminescent layer, a second electrode and a layer comprising conductive particles.

By incorporating the layer comprising conductive particles into the layer sequence of an electroluminescent device, the total reflection of the emitted light at the interface with the adjoining compact layer is disrupted and more light is decoupled from the electroluminescent device. The adjoining layer lies around the conductive particles so that light produced in the electroluminescent layer can leave the electroluminescent device via refraction at the edges of the particles.

A further advantage of the layer comprising conductive particles is that it may also act as a resistor. A high resistance of the layer comprising conductive particles prevents the first and second electrodes from being short-circuited. A high specific resistance of the layer comprising conductive particles also makes it possible, for example, for the layer to be applied in an unstructured manner on a structured first electrode, without the latter being short-circuited.

By means of the advantageously selected arrangements of the layer comprising conductive particles adjoining one of the electrodes, the light decoupling can be improved in the most varied electroluminescent devices.

In other advantageous embodiments, the particle diameter of the conductive particles may be at most twice the layer thickness of the adjoining layer, such as between 10 and 400 nm. This ensures that the roughness of the layer comprising conductive particles can be compensated by the adjoining layer. Furthermore, the scattering of light through the layer comprising conductive particles is low.

In another advantageous embodiment, the conductive particles comprise a conductive metal oxide or a conductive polymer. This provides inexpensive and simple manufacturing of the desired particle sizes.

In yet another advantageous embodiment, the conductive particles comprise a material selected from the group consisting of $SnO_2$, $ZnO$, $CeO_2$, $SnO_2$:In, $SnO_2$:Sb, $ZnO$:F, $ZnO$:Al and polyethylene dioxythiophene (PDOT) so that the specific resistance of the layer comprising conductive particles can be varied in a wide range and thus adapted to the structure and the purpose of the electroluminescent device and also to the further materials used in the electroluminescent device.

The invention will be further described with reference to examples of embodiments shown in the drawings to which, however, the invention is not restricted.

An electroluminescent device according to the invention comprises a substrate which is adjoined by a sandwich consisting of at least a first electrode, a layer comprising conductive particles, an electroluminescent layer and a second electrode. The sandwich may also comprise further layers.

The light produced in the electroluminescent device may leave through the substrate ("bottom emission") or through the second electrode ("top emission"). If it leaves through the substrate, the substrate and the first electrode are transparent. If it leaves through the second electrode, the second electrode is transparent and the first electrode is preferably reflective.

The arrangement of the layer comprising conductive particles in the sandwich depends on the direction in which light leaves. If the light leaves through the substrate, the layer comprising conductive particles adjoins the first electrode. If the light leaves through the second electrode, the layer comprising conductive particles adjoins the second, electrode.

Figure 1:
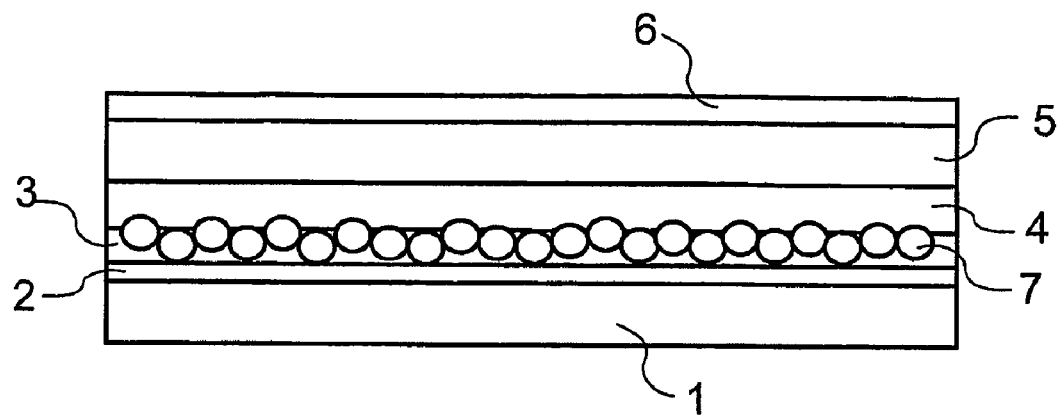
FIG. 1 shows, in cross section, an electroluminescent device according to the invention.

As shown in FIG. 1, an electroluminescent device with "bottom emission" comprises a substrate 1, preferably a transparent glass plate or a transparent polymer film. A sandwich adjoins the substrate 1, said sandwich consisting of at least a first electrode 2, a layer 3 comprising conductive particles 7, a conductive layer 4, an electroluminescent layer 5 and a second electrode 6. The first electrode 2 acts as anode and the second electrode 6 acts as cathode.

The first electrode 2 is preferably transparent and may comprise for example indium-doped tin oxide (ITO). The first electrode 2 may be structured and comprise a large number of parallel strips of the conductive material. Alternatively, the first electrode 2 may also be unstructured and be designed as a flat surface. The second electrode 6 may for example comprise a metal such as aluminum, copper, silver or gold, an alloy or n-doped silicon. The second electrode 6 may be structured and comprise a large number of parallel strips of the conductive material. It may be preferred for the second electrode 6 to comprise two or more conductive layers. It may in particular be preferred for the second electrode 6 to comprise a first layer of an alkaline-earth metal, such as calcium or barium for example, and a second layer of aluminum. The second electrode 6 is structured and comprises a large number of parallel strips of the conductive material or conductive materials.

The conductive layer 4 is in particular used to improve the injection of holes into the electroluminescent layer 5 and may also be referred to as a hole transport layer. The conductive layer 4 is preferably a conductive layer. The conductive layer 4 may for example comprise a mixture of polyethylene dioxythiophene (PDOT) and polystyrene sulfonate).

The electroluminescent layer 5 may comprise a light-emitting polymer or small organic molecules. Depending on the type of material used in the electroluminescent layer 5, the devices are referred to as LEPs (Light Emitting Polymers) or as polyLEDs or SMOLEDs (Small Molecule Organic Light Emitting Diodes). The electroluminescent layer 5 preferably comprises a light-emitting polymer. The light-emitting polymer used may be, for example, poly(p-phenylvinylene) (PPV) or a substituted PPV, such as dialkoxy-substituted PPV for example.

Alternatively, the sandwich may comprise additional layers, such as an electron transport layer between the second electrode 6 and the electroluminescent layer 5 for example.

Upon application of an appropriate voltage, typically one volt, positive and negative charge carriers are injected at the electrodes 2, 6, said charge carriers migrating to the electroluminescent layer 5, recombining there and thus producing light. This light passes through the conductive layer 4, the layer 3 comprising conductive particles 7, the first electrode 2 and the substrate 1 to the viewer. If the electroluminescent layer 5 is doped with fluorescent dyes, the light produced by the electron-hole recombination excites the dyes which in turn emit light, for example in one of the three primary colors.

Figure 2:
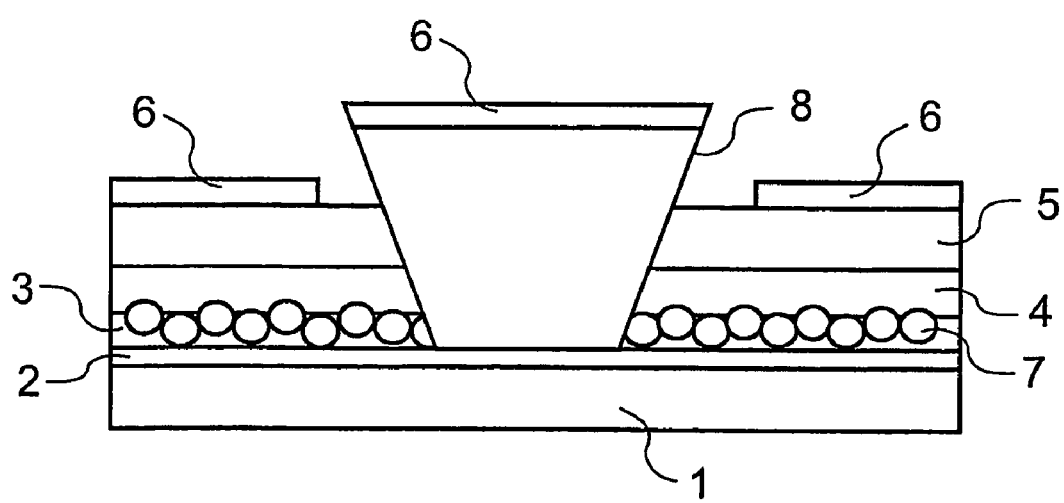
FIG. 2 shows, in cross section, a further electroluminescent device according to the invention.

FIG. 2 shows, in cross section, a further electroluminescent device according to the invention. In this embodiment, the electroluminescent device comprises PADDOs 8. PADDOs are structures made of photoresist which are used to produce the second electrode 6 in a sputtering step. Preferably, a PADDO 8 is a strip of photoresist in which the width of the strip on the side facing the substrate 1 is smaller than the width of the opposite side. The geometry of the PADDOs 8 ensures that during sputtering of the material for the second electrode 6, geometrically and electrically separate strips of the conductive material or conductive materials are produced.

The layer 3 comprising conductive particles 7 preferably comprises conductive particles of a conductive metal oxide or a conductive polymer. Materials which are actually insulators can be made to be conductive for example by means of doping with metal cations or by means of defects in the crystal lattices. The conductivity of materials which are conductive per se can also be increased by virtue of these measures. Suitable materials for the conductive particles are, for example, $SnO_2$, $ZnO$, $CeO_2$, $SnO_2$:In (ITO), $SnO_2$:Sb (ATO), ZnO:F or ZnO:Al. By way of example, PDOT can be used as conductive polymer.

The particle diameter of the conductive particles 7 is at most twice the thickness of the adjoining layer, for example the conductive layer 4, the electroluminescent layer 5 or the electron transport layer, and is preferably between 10 and 400 nm.

Alternatively, the layer 3 comprising conductive particles 7 may comprise, in addition to the conductive particles, insulating particles the diameter of which is preferably between 10 and 400 nm.

In the electroluminescent device, light which is produced in the electroluminescent layer 5 and passes to the interface with the layer 3 comprising conductive particles 7 is refracted at the edges of the conductive particles 7. This light then leaves the device through the first electrode 2 and the substrate 1. The electroluminescent device has improved light decoupling.

Depending on the material, the layer 3 comprising conductive particles 7 has a different value for the specific resistance, which is preferably greater than 100 Ωm. Particularly in one embodiment of an electroluminescent device comprising PADDO structures it is important that the specific resistance of a layer is high so that the strips of conductive material of the first electrode 2 are not short-circuited.

Since the layer 3 comprising conductive particles 7 takes over the resistance function, the further layers of the sandwich, particularly the conductive layer 4, can be modified within wide ranges in order to improve the efficiency of the electroluminescent device. The function as resistance for these layers no longer has to be taken into account during the modification.

Figure 3:
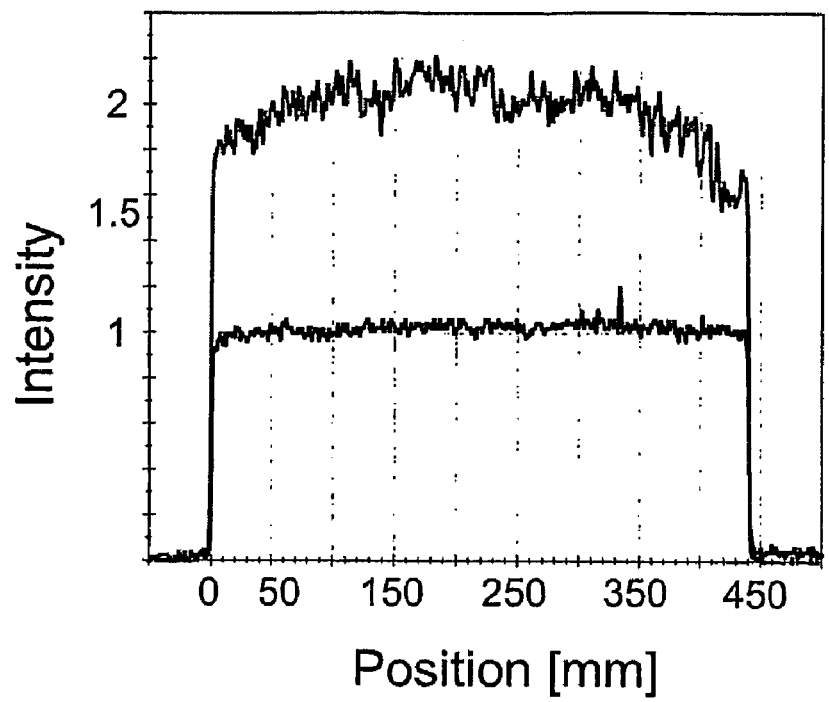
FIG. 3 shows the luminance profiles of a conventional electroluminescent device and of an electroluminescent device according to the invention.

FIG. 3 shows a line scan using a CCD camera above the emitting surface of an electroluminescent device according to the invention having a layer 3 comprising conductive particles 7, in comparison with a conventional electroluminescent device without this layer. The peak luminance of the conventional device has been standardized to 1. Both devices comprised a 140 nm-thick layer of ITO as first electrode 2, a 200 nm-thick layer of PDOT as conductive layer 4, an 80 nm-thick layer of PPV as electroluminescent layer 5 and a 205 nm-thick second electrode 6 consisting of a 5 nm-thick first layer of barium and a 200 nm-thick second layer of aluminum. The device according to the invention additionally had a 600 nm-thick layer 3 comprising conductive particles 7 of $SnO_2$ having a particle diameter of 200 nm.

Figure 4:
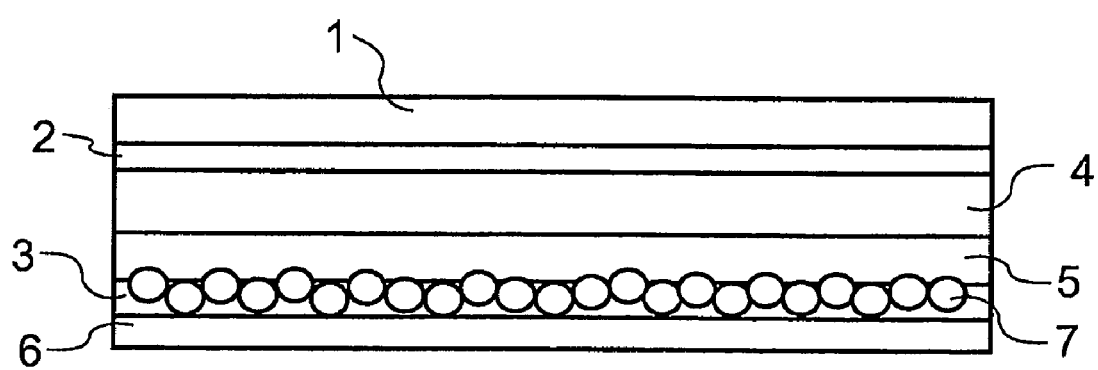
FIG. 4 shows, in cross section, yet another electroluminescent device according to the invention.

FIG. 4 shows an electroluminescent device with "top emission". In this embodiment, the layer 3 comprising conductive particles 7 adjoins the second electrode 6. The first electrode 2 is in this embodiment preferably reflective and may comprise a metal or an alloy. The second electrode 6 is transparent and comprises a transparent metal.

To produce a layer 3 comprising conductive particles 7, firstly an aqueous suspension comprising the conductive particles 7 is prepared. The concentration of the conductive particles 7 in this suspension is preferably between 10 and 20% by weight. Additionally, admixtures may be added to the suspension, said admixtures increasing the wetting properties or the viscosity of the aqueous suspension. By way of example, the aqueous suspension may comprise polyvinyl alcohol (PVA).

The aqueous suspension comprising the conductive particles 7 is preferably applied by means of spin coating to the substrate 1 provided with the first electrode 2. It may be advantageous to press the aqueous suspension beforehand through a membrane filter in order to remove dust and other particulate impurities. The substrate 1 that is to be coated is attached to a spin coater and the aqueous suspension is applied to the rotating substrate 1 at 100 to 1000 rpm. During the rotation, the liquid film is dried by means of an infrared lamp and then the coated substrate 1 obtained is placed in an oven at temperatures of from 150 to 180° C. A transparent layer 3 comprising conductive particles 7 that adheres fixedly to the first electrode 2 is thus obtained. The layer thickness of the layer 3 comprising conductive particles 7 is adapted to the respective dimensions of the electroluminescent device. The thickness of the layer 3 comprising conductive particles is preferably less than 1000 nm.

Following production of the layer 3 comprising conductive particles 7, the layers of the sandwich are applied using known methods and structured according to their function. The finished electroluminescent device may be provided with further layers or a housing, which protect the materials of the electroluminescent device from mechanical stress, moisture, etc.

EXAMPLE OF EMBODIMENT 1

An aqueous suspension having a concentration of 15% by weight of $SnO_2$ was prepared by appropriately diluting an $SnO_2$ sol having a particle diameter of 100 nm with deionized water. The resulting aqueous suspension was filtered through a membrane filter having a pore size of 5 μm. A 0.7 mm-thick glass plate as substrate 1, coated with a 140 nm-thick layer of ITO as first electrode 2, was placed in a spin coater and coated with the aqueous suspension comprising $SnO_2$. The substrate 1 was rotated at 200 rpm and the suspension applied was dried by means of an infrared lamp during the rotation. The coated substrate 1 was then placed in an oven at a temperature of 150° C. The layer thickness of the layer 3 comprising conductive particles of $SnO_2$ was 400 nm, said layer adhering well to the first electrode 2. A 200 nm-thick layer comprising PDOT and poly(styrene sulfonate) as conductive layer 4, an 80 nm-thick layer comprising PPV as electroluminescent layer 5 and a second electrode 6 consisting of a first 5 nm-thick layer of barium and a second 200 nm-thick layer of aluminum, were then applied.

A monochrome electroluminescent device having improved light decoupling was obtained, the luminance and efficiency of which, as shown in FIG. 3, are 100% better than in the case of an electroluminescent device without the layer 3 comprising conductive particles 7.

EXAMPLE OF EMBODIMENT 2

An electroluminescent device was produced analogously to example of embodiment 1, with the difference that the electroluminescent layer 5 is structured and comprises three different light-emitting polymers which emit light in the three primary colors—red, green and blue. The red-emitting polymer used may be, for example, poly[2-methoxy-5-(2'ethylhexyloxy)-1,4-(cyanovinylene)phenylene] (CN-PPV), the green-emitting polymer used may be, for example, poly(2-methoxy-5-(2'ethylhexyloxy)-1,4-phenylenevinylene) (MEH-PPV), and the blue-emitting polymer used may be, for example, poly(9,9-dioctylfluorene-2,7-diyl) (PFO).

A full-color electroluminescent device having improved light decoupling was obtained.

EXAMPLE OF EMBODIMENT 3

A 0.7 mm-thick glass plate as substrate 1 was coated with a 140 nm-thick layer of ITO as first electrode 2. A layer of a light-sensitive photoresist was applied to the electrode 2, exposed and developed such that PADDO structures 8 were produced. The remaining layers 3, 4, 5 and the second electrode 6 of the sandwich, as described in example of embodiment 1, were then applied A monochrome electroluminescent device having improved light decoupling was obtained.

EXAMPLE OF EMBODIMENT 4

A 0.7 mm-thick glass plate as substrate 1 was coated with a 140 nm-thick layer of ITO as first electrode 2. A 200 nm-thick layer 3 comprising ITO as conductive particles 7 was then applied in the same manner as described in example of embodiment 1. The particle diameter of the conductive particles 7 of ITO was 80 nm and the concentration of ITO particles in the aqueous suspension was 10% by weight. A 120 nm-thick layer of N,N'-bis(naphthalen-1-yl)-N,N'-bis(phenyl)benzidine (α-NPD) as conductive layer 4 was sputtered onto the layer 3 comprising conductive particles 7. The conductive layer 4 was coated with a 70 nm-thick electroluminescent layer 5 comprising 4,4'-bis(carbazol-9-yl)biphenyl (CBP), which was doped with 1% by weight of tris(2-phenylpyridine) iridium (III) ($Ir(ppy)_3$). A 90 nm-thick layer of tris(8-hydroxyquinoline) aluminum ($Alq_3$) was applied as electron transport layer to the electroluminescent layer 5. The second electrode 6 consisting of a first 1 nm-thick layer of LiF and a second 100 nm-thick layer of aluminum was then applied.

A monochrome electroluminescent device having improved light decoupling was obtained.

EXAMPLE OF EMBODIMENT 5

An electroluminescent device was produced analogously to example of embodiment 1, with the difference that the layer 3 comprising conductive particles 7 of $SnO_2$ is arranged not on the first electrode 2 but rather between the electroluminescent layer 5 and the second electrode 6. The first electrode 2 comprises Ag and the second electrode 5 comprises ITO. The electroluminescent device emits the light produced through the second electrode 6.

A monochrome electroluminescent device having improved light decoupling was obtained.

The invention claimed is:

1. An electroluminescent device having an exit surface for exit of light produced by the electroluminescent device, the electroluminescent device comprising:
   substrate; and
   a sandwich that adjoins the substrate, said sandwich comprising a first electrode, an electroluminescent layer, a second electrode and a layer comprising conductive particles,
   wherein the electroluminescent layer is between the first electrode and the second electrode, and
   wherein the layer comprising the conductive particles is adjoining to one electrode of the first electrode and the second electrode nearest the exit surface, the layer comprising the conductive particles being between the one electrode and the electroluminescent layer.

2. The electroluminescent device as claimed in claim 1, wherein the layer comprising conductive particles adjoins the first electrode.

3. The electroluminescent device as claimed in claim wherein the layer comprising conductive particles adjoins the second electrode.

4. The electroluminescent device as claimed in claim 1, wherein a particle diameter of the conductive particles is at most twice a layer thickness of an adjoining layer located between the layer comprising the conductive particles and the electroluminescent layer.

5. The electroluminescent device as claimed in claim 4, wherein a particle diameter of the conductive particles is between 10 and 400 nm.

6. The electroluminescent device as claimed in claim 1, wherein the conductive particles comprise a conductive metal oxide or a conductive polymer.

7. The electroluminescent device as claimed in claim 6, wherein the conductive particles comprise a material selected from the group consisting of $SnO_2$, ZnO, $CeO_2$, $SnO_2$:In, $SnO_2$:Sb, ZnO:F, ZnO:Al and polyethylene dioxythiophene (PDOT).

8. The electroluminescent device of claim 1, wherein the conductive particles are configured to refract the light for exit from the exit surface.

9. The electroluminescent device of claim 1, wherein the conductive particles have a diameter between 10 and 400 nm, and the layer comprising the conductive particles further comprises insulating particles having a diameter between 10 and 400 nm.

10. The electroluminescent device of claim 1, wherein the one electrode is structured into conductive strips and a resistance of the layer comprising the conductive particles is high enough to prevent short-circuiting the conductive strips of the one electrode.

* * * * *